(12) United States Patent
Senda et al.

(10) Patent No.: US 6,584,013 B2
(45) Date of Patent: Jun. 24, 2003

(54) SEMICONDUCTOR MEMORY DEVICE HAVING INCREASED MEMORY CAPACITY WHILE REDUCING MOUNTING AREA AND STAND-BY CURRENT

(75) Inventors: Minoru Senda, Hyogo (JP); Shinichi Kobayashi, Hyogo (JP); Masaki Tsukude, Hyogo (JP); Hirotoshi Sato, Hyogo (JP); Tadayuki Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/982,792

(22) Filed: Oct. 22, 2001

(65) Prior Publication Data

US 2002/0159289 A1 Oct. 31, 2002

(30) Foreign Application Priority Data

Apr. 25, 2001 (JP) ........................................ 2001-127782

(51) Int. Cl.$^7$ .............................................. G11C 11/34
(52) U.S. Cl. .................................. 365/185.08; 365/227
(58) Field of Search .............................. 365/185.08, 227

(56) References Cited

U.S. PATENT DOCUMENTS 6,339,318 B1 * 1/2002 Tanaka ....................... 323/313

FOREIGN PATENT DOCUMENTS

JP   57-105897 A  *  7/1982   ........... G11C/29/00

OTHER PUBLICATIONS

Betty Prince, "Semiconductor Memories", 1983, Wiley, 2$^{nd}$ edition, pp. 664–665.*

* cited by examiner

*Primary Examiner*—M. Tran
(74) *Attorney, Agent, or Firm*—McDermott, Will & Emery

(57) ABSTRACT

A dynamic-type memory A, a non-volatile memory B and a static-type memory C are enclosed in one package. Separated from a first terminal supplying a power-supply potential to the memories A and B, a second terminal supplying a power-supply potential to the memory C is provided. By stopping the supply of the power-supply potential to the first terminal at stand-by, stand-by current of a semiconductor memory device can be reduced. Therefore, the semiconductor memory device having an increased memory capacity while reducing a mounting area and consumption current at stand-by can be provided.

9 Claims, 16 Drawing Sheets

SEMICONDUCTOR MEMORY DEVICE HAVING INCREASED MEMORY CAPACITY WHILE REDUCING MOUNTING AREA AND STAND-BY CURRENT

BACKGROUND OF THE INVENTION

1. Field of the Invention

The present invention relates to a semiconductor memory device, and particularly, to a semiconductor memory device including a non-volatile memory circuit and a plurality of different types of volatile memory circuits.

2. Description of the Background Art

In recent years, a multi-chip package (MCP) has been used in which a plurality of semiconductor chips are stored in one package. For example, in a portable information terminal such as a portable telephone having a strict requirement for size reduction, the mounting area of the semiconductor memory device must be reduced, and therefore MCP has actively being employed.

FIG. 22 schematically shows the configuration of a conventional semiconductor memory device 600.

Referring to FIG. 22, semiconductor memory device 600 employs a multi-chip package in which a static random access memory (SRAM) 602 and a flash memory 604 are stored in one package. SRAM 602 receives supply of a power-supply potential VS2, at a power-supply pad 606 on the chip, from the outside of the package via a power-supply terminal 610. Flash memory 604 receives supply of a power-supply potential VS1, at a power-supply pad 608 on the chip, from the outside of the package via power-supply terminal 612.

Thus, conventionally, power-supply terminal 610 corresponding to SRAM 602 and power-supply terminal 612 corresponding to flash memory 604 were separately provided in semiconductor memory device 600, to supply externally-applied power-supply potentials to the two respective memories independently of each other. Therefore, for example, the power-supply to a memory not accessed in the stand-by state of a portable terminal was stopped in order to reduce stand-by current and to extend continuous service hours of the battery.

In an example where the conventional semiconductor memory device 600 as shown in FIG. 22 is used for e.g. a portable telephone, the power-supply potential may be supplied only to SRAM 602 in the stand-by state where no conversation is being made, and supplying of the power-supply potential to flash memory 604 may be stopped, in order to reduce the stand-by current.

An SRAM mounted on semiconductor memory device 600 is characterized by high-speed operation and small stand-by current. Whereas, a flash memory mounted to semiconductor memory device 600 in a similar manner is characterized in that data can be held in a non-volatile manner even though the supply of power-supply potential is stopped. However, the flash memory also has characteristics such that the stand-by current is somewhat larger than that of SRAM, and that data rewriting cannot be performed as fast as SRAM, since it takes time to erase data. Taking these two memory characteristics into consideration, reduction of consumption current has been attempted by applying the power-supply potential only to a requiring memory.

An example of a memory capable of faster operation compared to the flash memory is a dynamic random access memory (DRAM). The memory cell of the DRAM is smaller in size compared to that of SRAM, and the cost per bit is less expensive than that of SRAM. However, SRAM has been used, rather than DRAM, in a portable information terminal or the like having a strict requirement for size reduction, in order to simplify the system configuration.

This is because DRAM holds data as electric charge in a capacitor of a memory cell, and hence, rewriting, i.e. refreshing, is required in a certain cycle in order to continue holding the data. The DRAM also requires complex control related to the refreshing, such as refreshing operation per refresh cycle, and waiting for access to a memory under refresh until the end of the refresh cycle. SRAM is used since it requires no complex control as required in DRAM and thus can simplify the system configuration.

However, in recent years, the function of the portable information terminal has vastly been improved so as to also handle image data. Thus, a large capacity of memory function has increasingly been required. In such a case, use of SRAM having a memory cell size 10 times larger than that of DRAM would increase the chip size in order to realize the memory with a large capacity. The increase of the chip size would not only raise the cost of the portable information terminal, but also would increase the mounting area of the memory.

Then, a memory that can be accessed in a manner similar to that of SRAM by using small memory cells of DRAM, e.g. pseudo-SRAM, may be used in place of the conventional SRAM. However, the memory cells of DRAM requires refresh, which results in larger stand-by current compared to SRAM.

Therefore, use of MCP with the memory using the memory cells of DRAM embedded in place of the conventionally embedded SRAM would increase the consumption current at stand-by, and hence is inappropriate as a memory directed to a portable information terminal operating by a battery with the strict requirement for the reduction of consumption current.

SUMMARY OF THE INVENTION

It is an object of the present invention to provide a semiconductor memory device having a small mounting area and a large memory capacity, and capable of reducing consumption current at stand-by.

According to an aspect of the present invention, a semiconductor memory device transferring storage data with an external source includes first and second volatile memory circuits, a non-volatile memory circuit, and a package.

The first volatile memory circuit is of a first type, and receives a power-supply potential from a first power-supply node. The second volatile memory circuit is of a second type different from the first type, and receives a power-supply potential from a second power-supply node. The non-volatile memory circuit receives a power-supply potential from a third power-supply node. The package encloses the first and second volatile memory circuits and the non-volatile memory circuit.

Therefore, a main advantage of the present invention is that the power-supply nodes are separately provided so that consumption current at stand-by can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
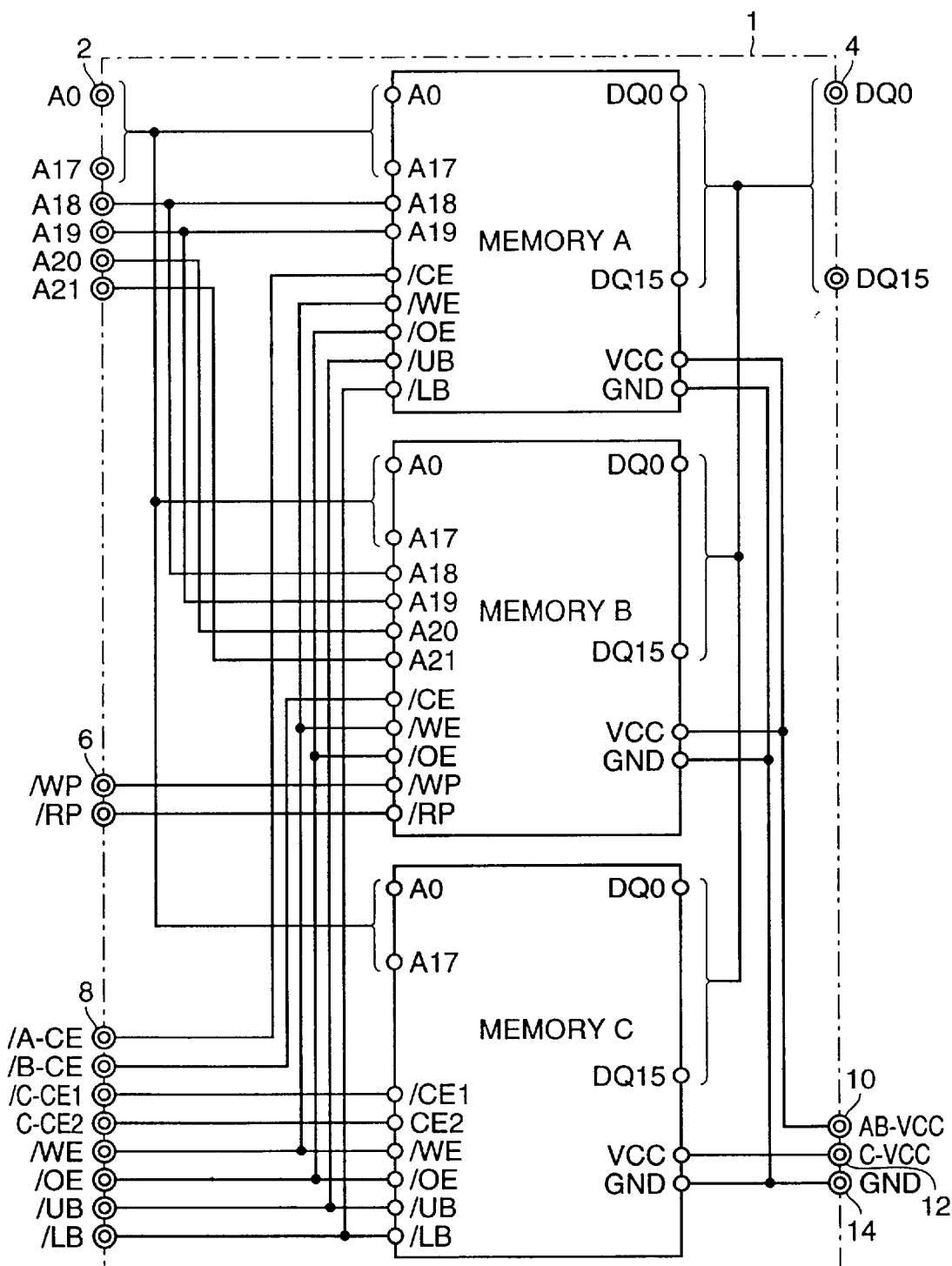
FIG. 1 is a schematic block diagram showing the configuration of a semiconductor memory device 1 according to the first embodiment of the present invention.

Embodiments of the present invention will be described below in detail with reference to the drawings. It is noted that the same reference characters denote the same or corresponding portions.

First Embodiment

FIG. 1 is a schematic block diagram showing the configuration of a semiconductor memory device 1 according to the first embodiment of the present invention.

Referring to FIG. 1, semiconductor memory device 1 includes a terminal group 2 receiving address signals A0 to A21 from the outside; a terminal group 4 transmitting/receiving data signals DQ0 to DQ15 to/from the outside; a terminal group 6 receiving a write protect signal WP and a reset power down input /RP from the outside; a terminal group 8 receiving control signals /A-CE, /B-CE, /C-CE1, C-CE2, /WE, /OE, /UB and /LB from the outside; a terminal 10 receiving a power-supply potential AB-VCC from the outside; a terminal 12 receiving a power-supply potential C-VCC from the outside; and a terminal 14 receiving a ground potential GND from the outside.

Semiconductor memory device 1 further includes a volatile memory A having memory cells of a dynamic type, a non-volatile memory B; and a volatile memory C having memory cells of a static type. A power-supply node at which memory A receives the supply of power-supply potential VCC and a power-supply node at which memory B receives the supply of power-supply potential VCC are both connected to terminal 10. A power-supply node at which memory C receives the supply of power-supply potential VCC is connected to terminal 12. A ground node at which memory A receives the supply of ground potential GND, a ground node at which memory B receives the supply of ground potential GND, and a ground node at which memory C receives the supply of ground potential GND are all connected to terminal 14.

Data input/output nodes at which memory A inputs/outputs data signals DQ0 to DQ15 are respectively connected to corresponding bits of terminal group 4. As in the case with memory A, data input/output nodes at which memory B transmits/receives data signals DQ0 to DQ15 are respectively connected to corresponding bits of data terminal group 4. As in the cases with memories A and B, data input/output nodes at which memory C transmits/receives data signals DQ0 to DQ15 are respectively connected to corresponding bits of data terminal group 4.

Terminals in terminal group 2 receiving address signals A0 to A17 are respectively connected to address input nodes of memory A receiving address signals A0 to A17, corresponding bits by bits. Similarly, address input nodes of memory B at which address signals A0 to A17 are input are respectively connected to the terminals of terminal group 2 receiving address signals A0 to A17, corresponding bits by bits. Likewise, address input nodes of memory C at which address signals A0 to A17 are input are respectively connected to the terminals of terminal group 2 receiving address signals A0 to A17, corresponding bits by bits.

By connecting address input nodes and data input/output nodes common to memories A, B and C within the package, the number of pins can be reduced, resulting in a smaller mounting area.

A terminal of terminal group 2 receiving address signal A18 is connected to address input nodes of memories A and B to which address signal A18 is input. A terminal of terminal group 2 receiving address signal A19 is connected to address input nodes of memories A and B to which address signal A19 is input. Terminals of terminal group 2 receiving address signals A20, A21 are connected, respectively, to address input nodes of memory B to which address signals A20 and A21 are input.

A terminal of terminal group 8 receiving control signal /A-CE is connected to a control signal input node of memory A to which a chip enable signal /CE is input. A terminal of terminal group 8 receiving control signal /B-CE is connected to a control signal input node of memory B to which chip enable signal /CE is input. Terminals of terminal group 8 receiving control signals /C-CE1, C-CE2 are connected, respectively, to control signal input nodes of memory C to which chip enable signals /CE1, CE2 are input.

A terminal of terminal group 8 receiving control signal /WE is connected to each of control signal input nodes of memories A, B and C, to which write enable signal /WE is input. A terminal of terminal group 8 receiving control signal /OE is connected to each of control signal input nodes of memories A, B and C, to which write enable signal /OE is input. A terminal of terminal group 8 receiving control signal /UB is connected to each of control signal input nodes of memories A, B and C, to which write enable signal /UB is input. A terminal of terminal group 8 is connected to each of control signal input nodes of memories A, B and C, to which write enable signal /LB is input.

Figure 2:
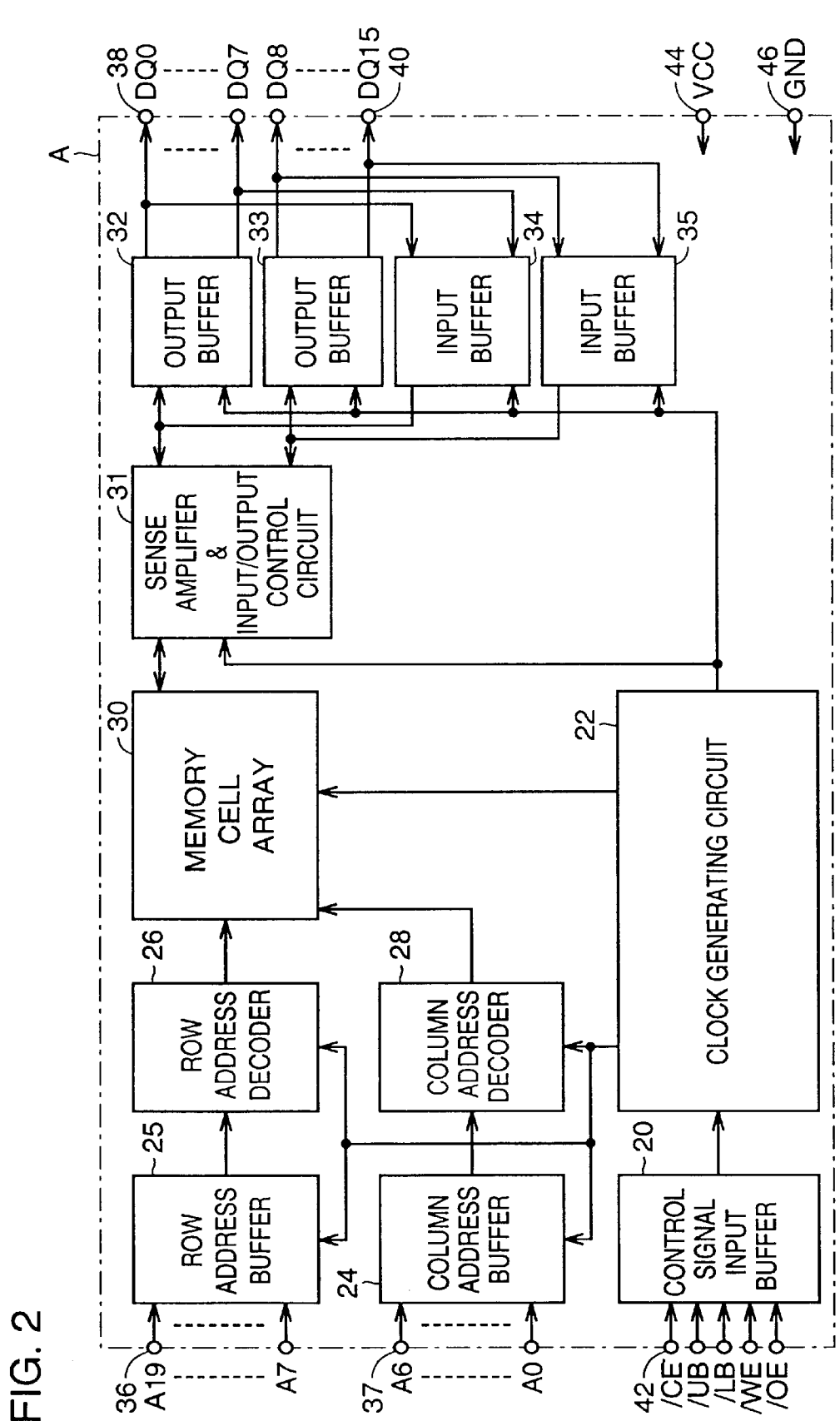
FIG. 2 is a block diagram showing the schematic configuration of a memory A shown in FIG. 1.

FIG. 2 is a block diagram showing the schematic configuration of memory A shown in FIG. 1.

Referring to FIG. 2, memory A includes an input terminal group 42 receiving control signals /CE, /OE, /WE, /LB, and /UB; a terminal group 38 at which data signals DQ0 to DQ7 are input/output; a terminal group 40 at which data signals DQ8 to DQ15 are input/output; a terminal group 37 at which address signals A0 to A6 are input; a terminal group 36 to which address signals A7 to A19 are input; a power-supply terminal 44 to which a power-supply potential VCC is applied; and a ground terminal 46 to which a ground voltage GND is applied.

Control signal /CE is a chip enable signal for selecting memory A when memory A is externally accessed. Control signal /OE is an output enable signal setting memory A to be in a read mode while activating an output buffer. Control signal /WE is a write enable signal setting memory A to be in a write mode. Control signal /LB is a signal for selecting that data is input/output at data terminal group 38 on the lower-bit side. Control signal /UB is a signal for selecting that data is input/output at data terminal group 40 on the upper-bit side.

Memory A further includes a control signal input buffer 20 amplifying an signal applied from input terminal group 42 and transmitting the amplified signal to the inside; and a clock generating circuit 22 outputting to each block a control clock corresponding to a predetermined operation mode, such as read, write and refresh, of memory A, in accordance with the output of control signal input buffer 20.

Memory A further includes a column address buffer 24 receiving address signals A0 to A6 in accordance with the output of clock generating circuit 22 and transmitting the signals to the inside; and a row address buffer 25 receiving address signals A7 to A19 in accordance with the output of clock generating circuit 22 and transmitting the signals to the inside.

Memory A further includes a row address decoder 26 receiving an internal address signal output from row address buffer 25 in accordance with the output of control clock generating circuit 22 and selecting a word line WL; a column address decoder 28 receiving an internal address signal output from column address buffer 24 in accordance with the output of clock generating circuit 22 and selecting a bit line BL; a memory cell array 30 including memory cells arranged in a matrix; and a sense amplifier & input/output control circuit 31 amplifying the output read from memory cell array 30.

Memory A further includes a lower-bit-side input buffer 34 receiving data signals DQ0 to DQ7 from terminal group 38 in accordance with the output of clock generating circuit 22 and transmitting the signals to sense amplifier & input/output control circuit 31; a lower-bit-side output buffer 32 receiving a signal from sense amplifier & input/output control circuit 31 in accordance with the output of clock generating circuit 22 and outputting the data signals to terminal group 38; an upper-bit-side input buffer 35 receiving data signals DQ8 to DQ15 from terminal group 40 in accordance with the output of clock generating circuit 22, and transmitting the signals to sense amplifier & input/output control circuit 31; and an upper-bit-side output buffer 33 outputting the data read from sense amplifier & input/output control circuit 31 to terminal group 40 in accordance with the output of clock generating circuit 22.

Figure 3:
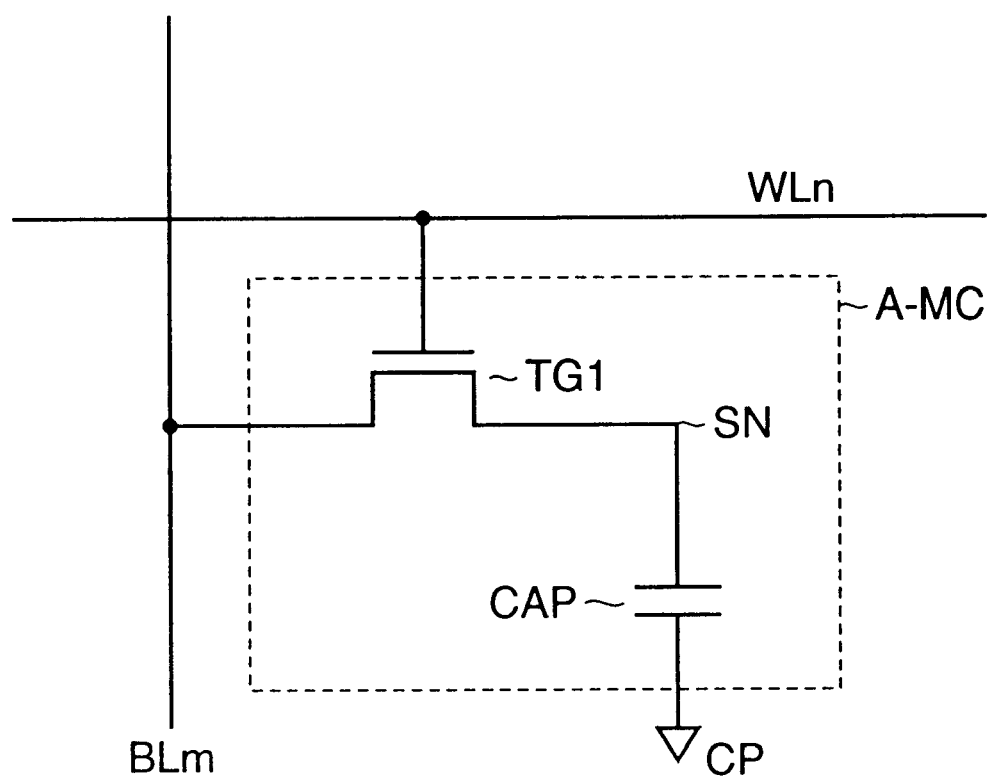
FIG. 3 is a circuit diagram showing the configuration of one of memory cells A-MC arranged in a matrix of rows and columns in a memory cell array 30 shown in FIG. 2.

FIG. 3 is a circuit diagram showing the configuration of one of memory cells A-MC arranged in a matrix of rows and columns in memory cell array 30 shown in FIG. 2.

Referring to FIG. 3, memory cell A-MC includes a transfer transistor TG1 connected between a bit line BLm and a storage node SN and connected to a word line WLn at the gate thereof; and a capacitor CAP connected between storage node SN and a cell plate CP. It is noted that word line WLn is selectively activated by row address decoder 26. Moreover, bit line BLm is selectively connected to input/output control circuit 31 by column address decoder 28 shown in FIG. 2.

Figure 4:
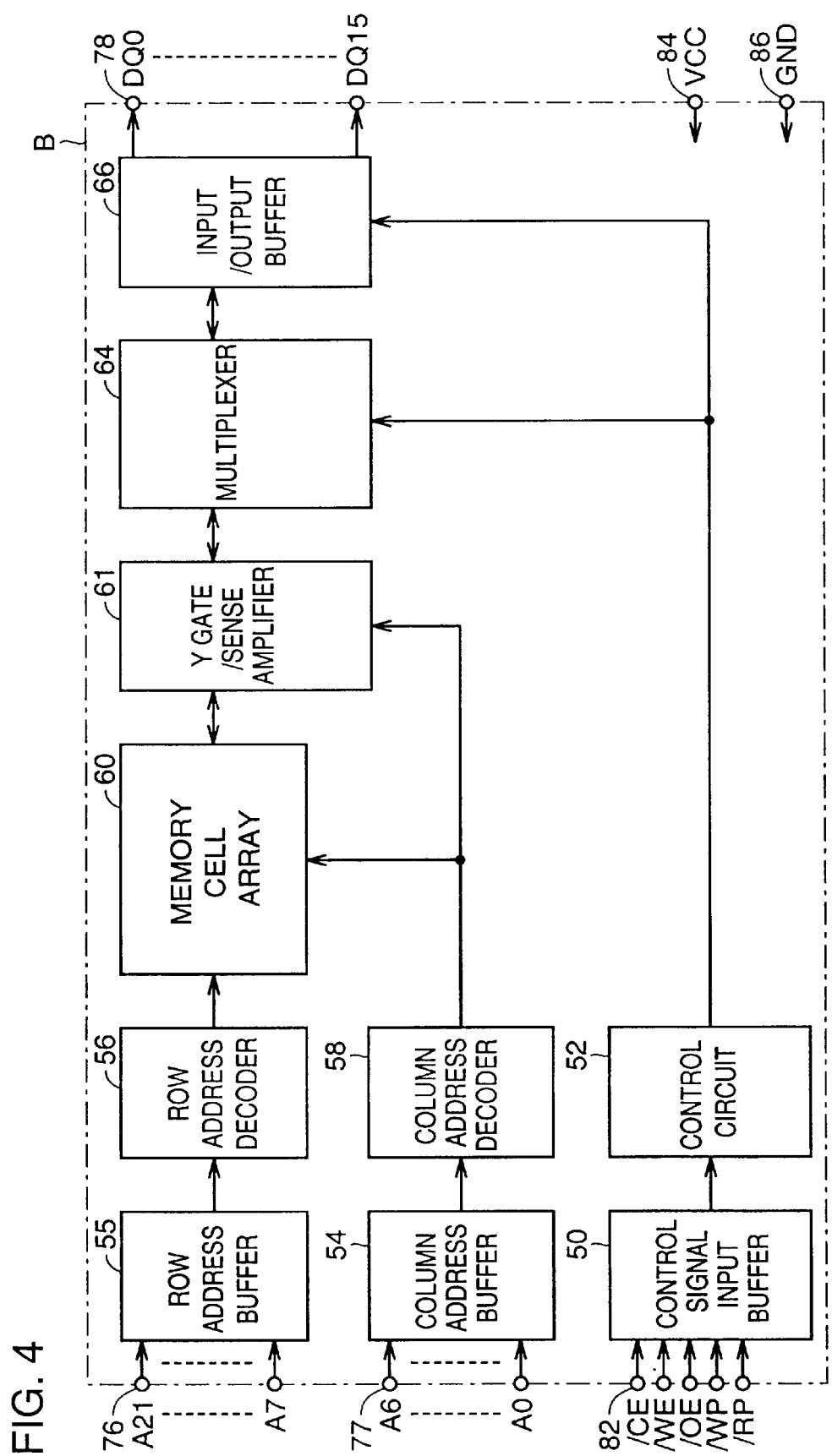
FIG. 4 is a block diagram showing the configuration of a memory B shown in FIG. 1.

FIG. 4 is a block diagram showing the configuration of memory B shown in FIG. 1.

Referring to FIG. 4, memory B includes an input terminal group 82 receiving control signals /CE, /OE, /WE, /WP, and /RP; a terminal group 78 at which data signals DQ0 to DQ15 are input/output; a terminal group 77 to which address signals A0 to A6 are input; a terminal group 76 to which address signals A7 to A19 are input; a power-supply terminal 84 to which a power-supply potential VCC is applied; and a ground terminal 86 to which a ground voltage GND is applied.

Control signal /CE is a chip enable signal for selecting memory B when memory B is externally accessed. Control signal /OE is an output enable signal setting memory B to be in a read mode while activating an output buffer. Control signal /WE is a write enable signal setting memory B to be in a write mode. Control signal /RP is a control signal setting memory B to be in a power down mode. Control signal /WP is a control signal setting validity/invalidity of the setting of a lock bit indicating inhibition of erasing per block in memory B.

Memory B further includes a control signal input buffer 50 amplifying a signal applied from input terminal group 82 and transmitting the amplified signal to the inside; and a control circuit 52 outputting to each block a control signal corresponding to a predetermined operation mode, such as read, program and erase, of memory B, in accordance with the output of control signal input buffer 50.

Control circuit 52 has, though not shown, a ROM therein, and includes a write & erase control unit controlling writing and erasing based on a program code held in the ROM; and a voltage generating circuit generating and outputting various internal voltages under the control of the write & erase control unit.

Memory B further includes a column address buffer 54 receiving address signals A0 to A6; a column address decoder 58 receiving an internal address signal from column address buffer 54 and performing a column-related selecting operation; a row address buffer 55 receiving address signals A7 to A21; and a row address decoder 58 receiving an internal address signal from row address buffer 55 and performing a row-related selecting operation.

Row address decoder 56 includes, though not shown, a WL decoder selecting a word line, an SG decoder selecting a select gate, a WELL decoder selecting a well region corresponding to a selected memory block, and an SL decoder selecting a source line.

Memory B further includes a memory cell array 60 including memory cells arranged in a matrix; and a Y-gate/ sense amplifier 61 amplifying and reading out the output from the region of memory cell array 60 designated by row address decoder 56 and column address decoder 58. Y-gate/ sense amplifier 61 selects a column at the time of reading in accordance with the output of control circuit 52 and performing reading operation at the sense amplifier.

Memory cell array 60 includes, though not shown, a plurality of memory blocks each formed within a separate well. Each of the plurality of memory blocks is to be a unit for data erasing.

Memory B further includes an input/output buffer 66 for transmitting/receiving data input/output signals DQ0 to DQ15 via terminal group 78; and a multiplexer 64 transmitting data to/from input/output buffer 66.

Figure 5:
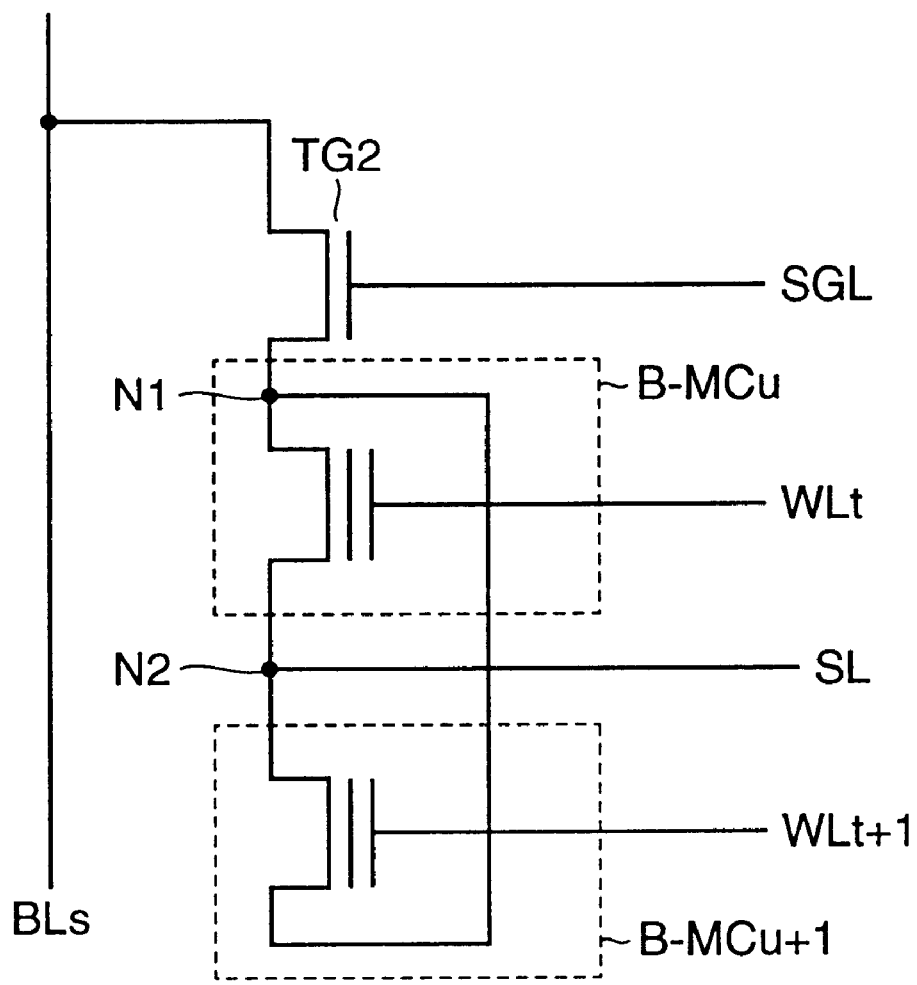
FIG. 5 is a circuit diagram showing the configuration of memory cells B-MC arranged in a matrix of rows and columns in a memory cell array 60 shown in FIG. 4.

FIG. 5 is a circuit diagram showing the configuration of memory cells B-MC arranged in a matrix of rows and columns in memory cell array 60 shown in FIG. 4.

Referring to FIG. 5, each of memory cells B-MCu, B-MCu+1 is an MOS transistor having a floating gate.

Memory cell B-MCu is connected between nodes N1 and N2, and the selection gate thereof is connected to a word line WLt. Memory cell B-MCu+1 is connected between nodes N1 and N2, and the selection gate thereof is connected to a word line WLt+1. A transfer transistor TG2 is provided between a bit line BLs and node N1. The gate of transfer transistor TG2 is connected to a select gate line SGL. Moreover, node N2 is connected to a source line SL.

It is noted that word lines WLt, WLt+1 are selectively activated by row address decoder 56 shown in FIG. 4. Furthermore, bit line BLs is selectively coupled to Y-gate/ sense amplifier 61 by column address decoder 58.

Figure 6:
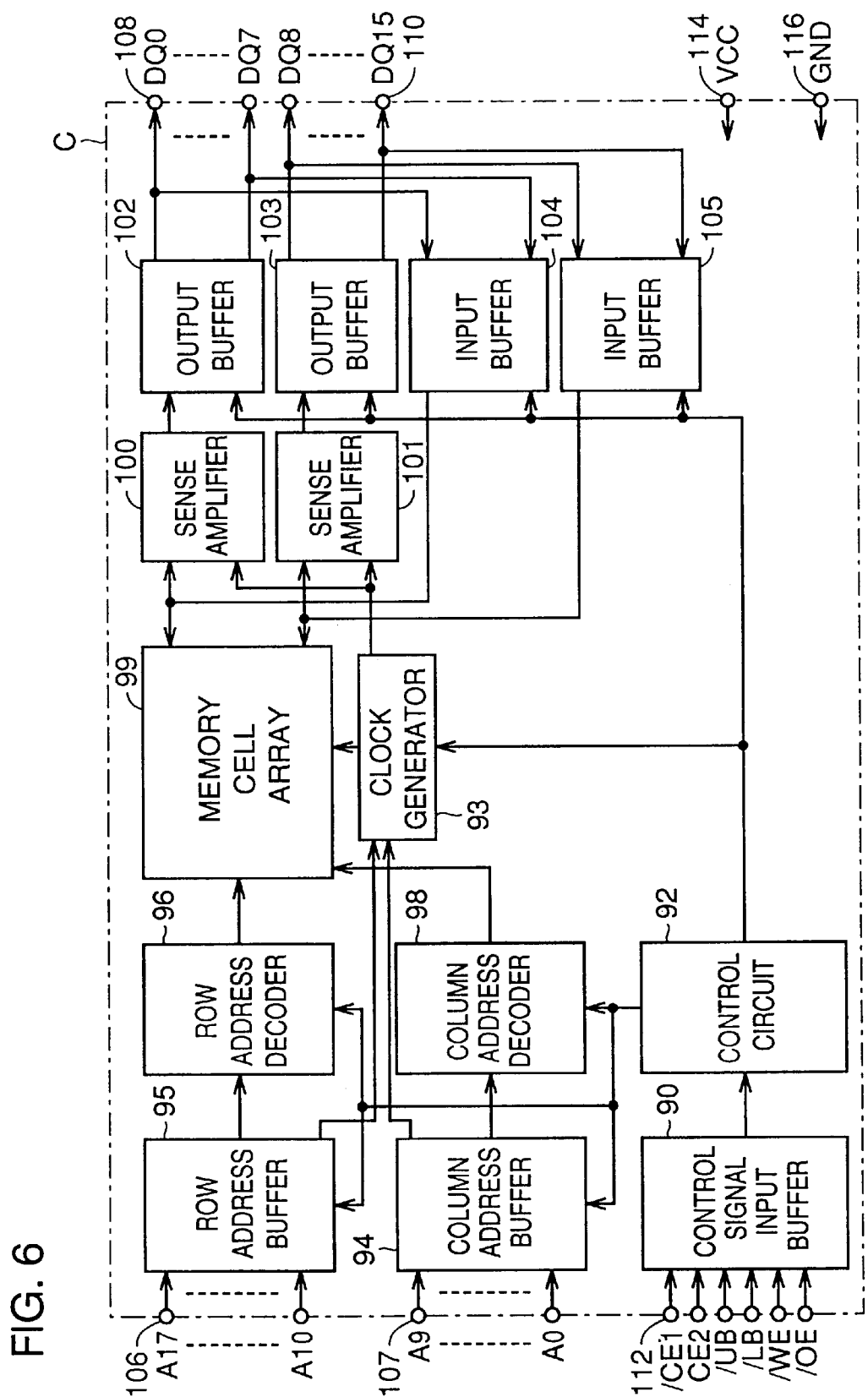
FIG. 6 is a schematic block diagram showing the configuration of a memory C shown in FIG. 1.

FIG. 6 is a schematic block diagram showing the configuration of memory C shown in FIG. 1.

Referring to FIG. 6, memory C includes an input terminal group 112 receiving control signals /CE1, CE2, /OE, /WE, /LB, and /UB; a terminal group 108 at which data signals DQ0 to DQ7 are input/output; a terminal group 110 at which data signals DQ8 to DQ15 are input/output; a terminal group 107 to which address signals A0 to A9 are input; a terminal group 106 to which address signals A10 to A17 are input; a power-supply terminal 114 to which power-supply potential VCC is applied; and a ground terminal 116 to which a ground voltage GND is applied.

Control signals /CE1, CE2 are chip enable signals for selecting memory C when memory C is externally accessed. Control signal /OE is an output enable signal setting memory C to be in a read mode while activating an output buffer. Control signal /WE is a write enable signal setting memory C to be in a write mode. Control signal /LB is a signal for selecting that data is input/output from data terminal group 108 on the lower-bit side. Control signal /UB is a signal for selecting that data is input/output from data terminal group 110 on the upper-bit side.

Memory C further includes a control signal input buffer 90 amplifying a signal applied from input terminal group 112 and transmitting the amplified signal to the inside; and a control circuit 92 outputting a control clock corresponding to a predetermined operation mode, such as read, write or the like, of memory C to each block, in accordance with the output of control signal input buffer 90.

Memory C further includes a column address buffer 94 receiving address signals A0 to A9 in accordance with the output of control circuit 92 and transmitting the signals to the inside, and a row address buffer 95 receiving address signals A10 to A17 in accordance with the output of control circuit 92 and transmitting the signals to the inside.

Memory C further includes a row address decoder 96 receiving an internal address signal output by row address buffer 95 in accordance with the output of control circuit 92, and selecting a word line WL; a column address decoder 98 receiving an internal address signal output by column address buffer 94 in accordance with the output of control circuit 92, and selecting a bit line; a clock generator 93 monitoring the outputs of row address buffer 95 and column address buffer 94 to detect a change in an address, and generating a control clock signal in accordance with the output of control circuit 92; and a memory cell array 99 including memory cells arranged in a matrix.

Memory C further includes sense amplifiers 100, 101 amplifying the output from memory cell array 99 and reading out the amplified output; and output buffers 102, 103 respectively receiving the outputs of sense amplifiers 100, 101 and outputting data signals respectively to terminal groups 108, 110.

Memory C further includes input buffers 104, 105 receiving, respectively, data signals DQ0 to DQ7, DQ8 to DQ15 from terminal groups 108, 110 in accordance with the output of control circuit 92, and writing the signals to memory cell array 99.

Figure 7:
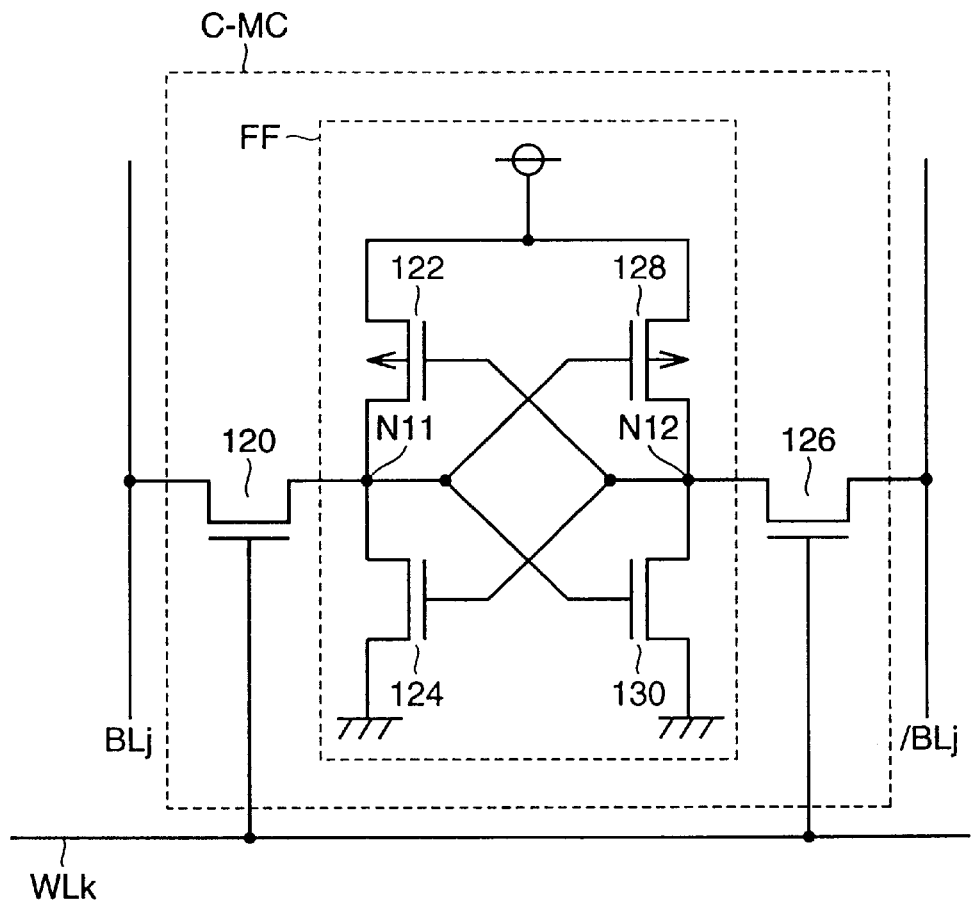
FIG. 7 is a circuit diagram showing the configuration of one of memory cells C-MC arranged in a matrix of rows and columns in a memory cell array 99 shown in FIG. 6.

FIG. 7 is a circuit diagram showing the configuration of one of memory cells C-MC arranged in rows and columns in memory cell array 99 in FIG. 6.

Referring to FIG. 7, memory cell C-MC includes a transfer transistor 120 connected between a bit line BLj and a node N11, and connected to a word line WLk at the gate thereof; a transfer transistor 126 connected between a bit line /BLj and a node N12, and connected to word line WLk at the gate thereof; and a flip-flop FF complementarily holding data at nodes N11, N12.

Flip-flop FF includes a P-channel MOS transistor 122 connected between a power-supply node and node N11, and connected to node N12 at the gate thereof; an N-channel MOS transistor 124 connected between node N11 and a ground node, and connected to node N12 at the gate thereof; a P-channel MOS transistor 128 connected between the power-supply node and node N12, and connected to node N11 at the gate thereof; and an N-channel MOS transistor 130 connected between node N12 and a ground node and connected to node N11 at the gate thereof.

It is noted that word line WLk is selectively activated by row address decoder 96 shown in FIG. 6. Moreover, bit lines BLj, /BLj are selectively connected to sense amplifier 100 or 101 by column address decoder 98.

Figure 8:
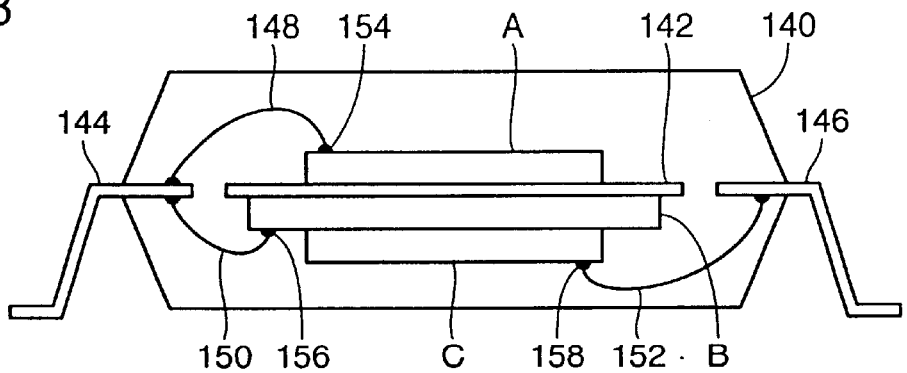
FIG. 8 is a section view showing the first example in which semiconductor memory device 1 of the first embodiment is enclosed in one package.

FIG. 8 is a section view showing the first example in which semiconductor memory device 1 according to the first embodiment is enclosed in one package.

Referring to FIG. 8, a die pad 142 is provided inside of a package 140, and one side of the die pad is provided with memory A whereas the other side thereof is provided with memory B, by die bonding. Further, memory C is arranged in a laminated manner at the lower portion of memory B. A VCC pad 154 of memory A is connected to a lead 144 by a wire 148. A VCC pad 156 of memory B is connected to lead 144 by a wire 150. A VCC pad 158 of memory C is connected to a lead 146 by a wire 152.

Lead 144 corresponds to terminal 10 in FIG. 1, and lead 146 corresponds to terminal 12 in FIG. 1.

Figure 9:
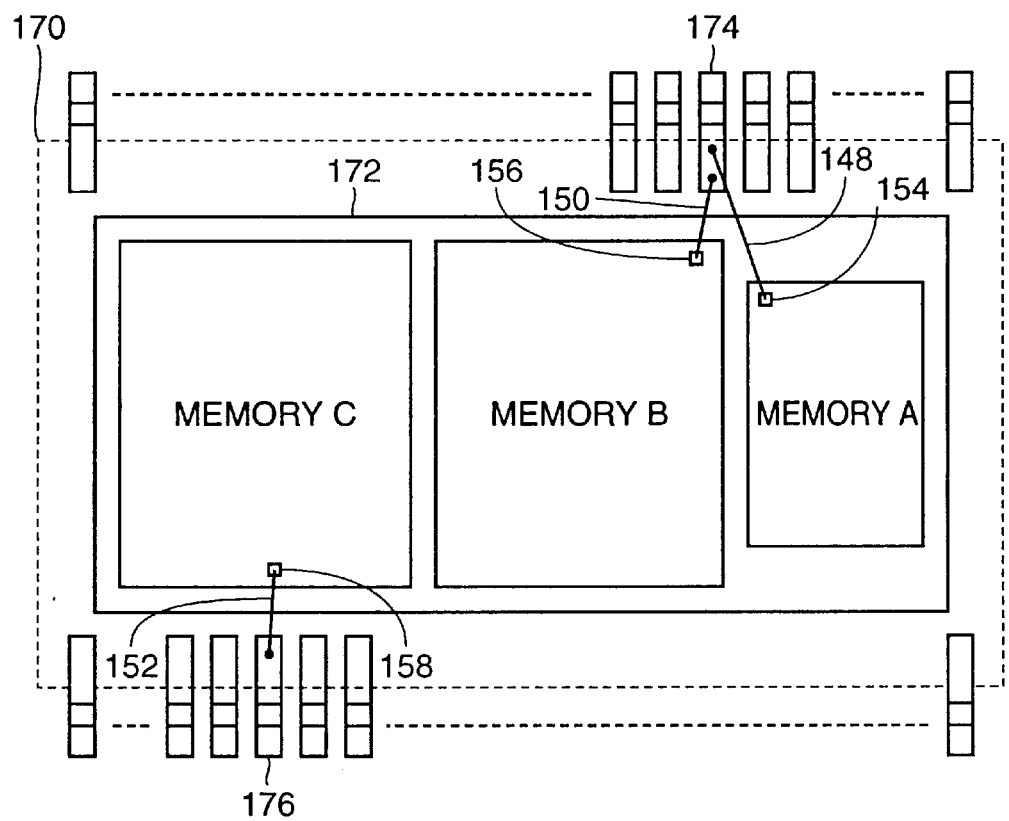
FIG. 9 is a plan view showing another example in which memories A, B and C are enclosed in a package 170.

FIG. 9 is a plan view showing another example in which memories A, B and C are enclosed in a package 170.

Referring to FIG. 9, memories C, B and A are arranged in a single horizontal row on a die pad 172. VCC pad 154 of memory A is connected to a lead 174 by wire 148. VCC pad 156 of memory B is connected to lead 174 by wire 150. VCC pad 158 of memory C is connected to lead 176 by wire 152. Even if the chips are arranged two-dimensionally as shown in FIG. 9, the mounting area can be reduced compared to the case where each chip is enclosed in a separate package.

As shown in FIGS. 8 and 9, by connecting VCC pads of memories A and B to one lead while connecting VCC pad of memory C to another lead, power input to memory C can be controlled, independently of memories A and B.

Figure 10:
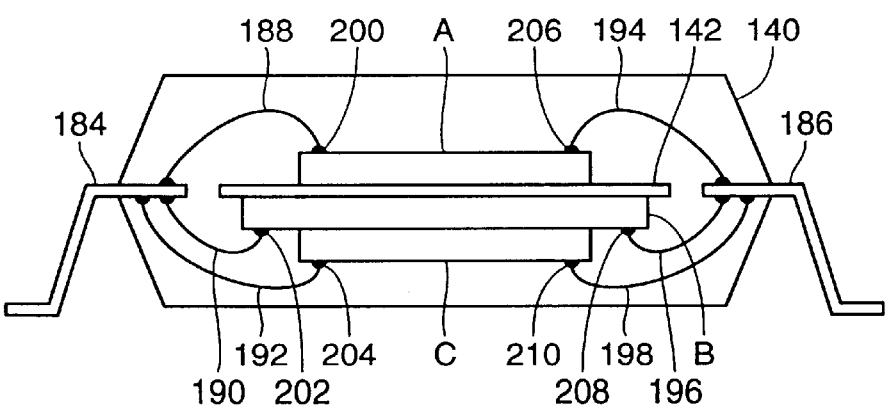
FIG. 10 is a section view illustrating a connection state of terminals receiving address signals and data signals in the case where memories A, B and C are laminated and enclosed in a package 140.

FIG. 10 is a section view illustrating a connection state of terminals receiving address signals and data signals in the case where memories A, B and C are laminated to be enclosed in package 140.

Referring to FIG. 10, a pad 200 of memory A is connected to a lead 184 by a wire 188. Pads 202, 204 of memories B, C are connected to lead 184 by wires 190, 192, respectively.

Likewise, a pad 206 of memory A is connected to a lead 186 by a wire 194, whereas pads 208, 210 of memories B, C are connected to lead 186 by wires 196, 198, respectively. Thus, corresponding address input nodes and corresponding data input/output nodes of memories A, B and C can be connected to the respective common leads.

Figure 11:
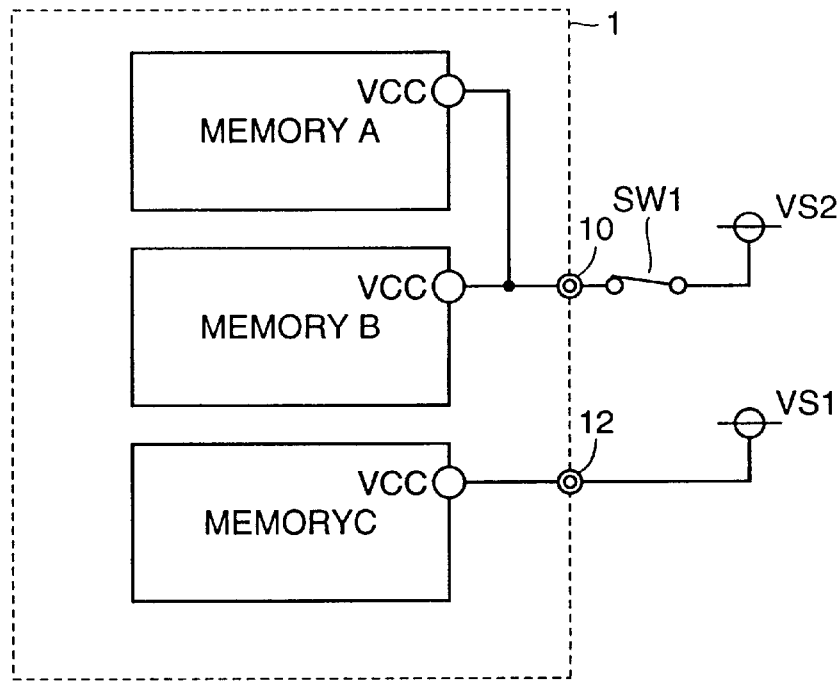
FIG. 11 illustrates the operating state of semiconductor memory device 1.
Figure 12:
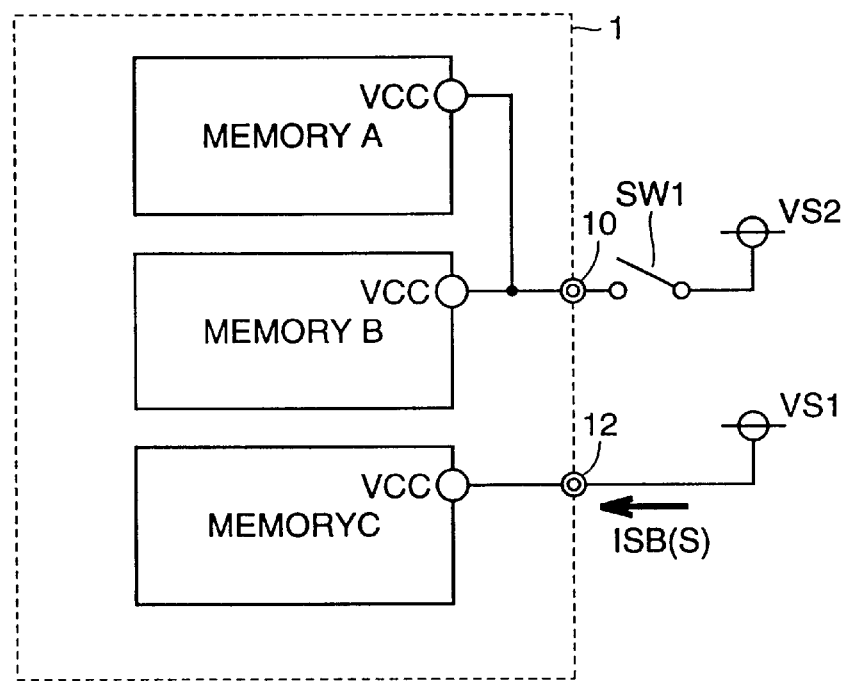
FIG. 12 illustrates the stand-by state of semiconductor memory device 1.

FIGS. 11 and 12 illustrate the operating state and stand-by state of semiconductor memory device 1.

Referring to FIG. 11, in the operating state, terminal 10 is supplied with power-supply potential VS2 and terminal 12 is supplied with power-supply potential VS1. Thus, the power-supply potential is received from the outside by two pins of power-supply terminals, so that the power-supply terminals can be maintained compatible with those of the conventional semiconductor memory device 600 shown in FIG. 22, facilitating replacement.

Referring to FIG. 12, in the stand-by state, for example, a switch SW1 connected external to terminal 10 is made open to stop the supply of power-supply potential to memories A and B. On the other hand, power-supply potential VS1 is continuously supplied to terminal 12, and therefore the stand-by state is attained for performing operation if required. Memory A is a dynamic-type memory which requires refresh and therefore large stand-by current. Moreover, memory B also requires, though not so much as memory A, large stand-by current. Whereas, memory C uses a flip-flop as a memory cell to hold data, so that no refreshing operation is required and current at stand-by is extremely small. Therefore, by stopping the supply of power-supply potential to terminal 10 while supplying the power-supply potential only to terminal 12 during the stand-by, the stand-by current can be only ISB(S).

As has been described above, according to the invention shown in the first embodiment, a semiconductor memory device having an increased memory capacity while reducing the mounting area and the stand-by current can be obtained.

Second Embodiment

Figure 13:
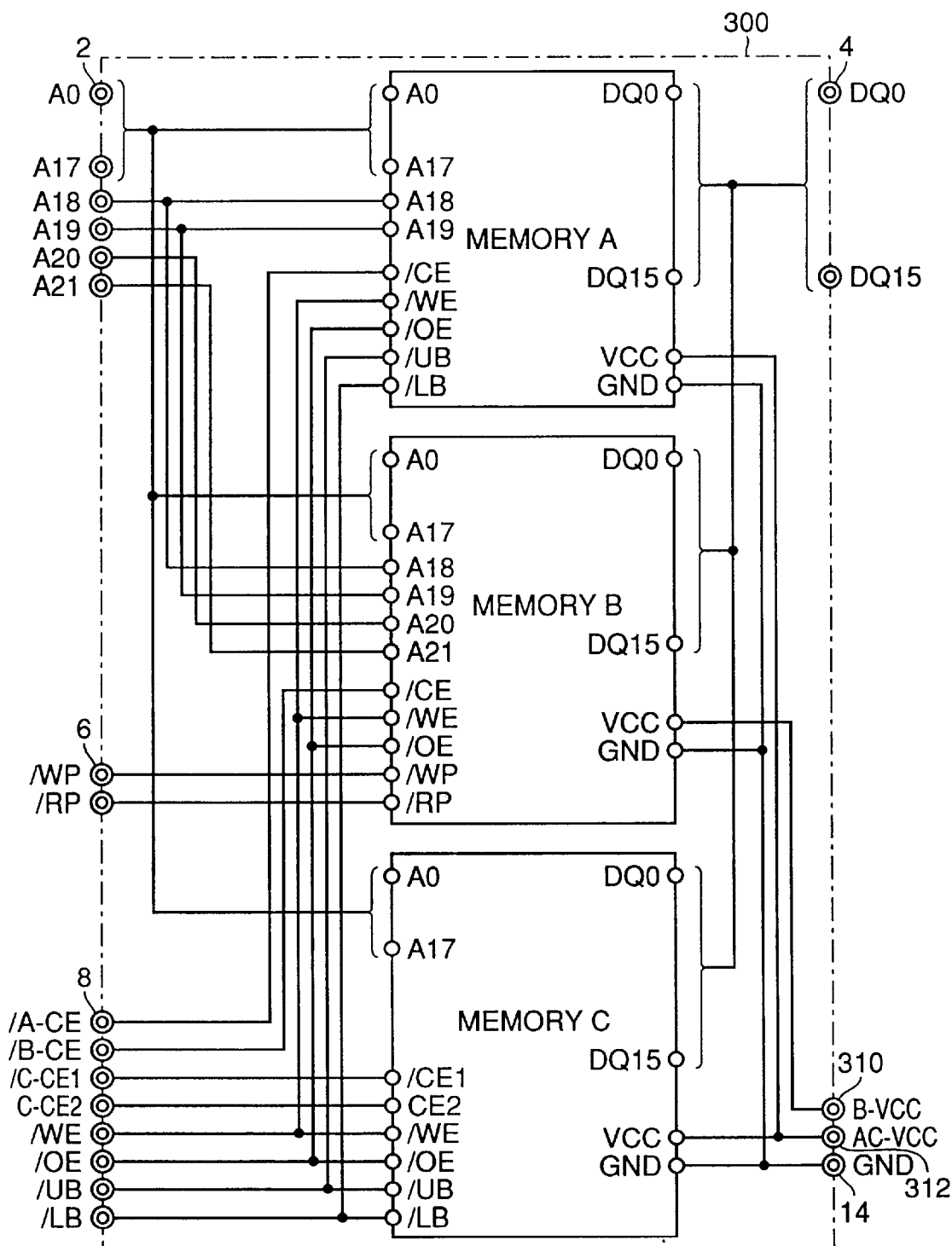
FIG. 13 is a block diagram showing the configuration of a semiconductor memory device 300 according to the second embodiment.

FIG. 13 is a block diagram showing the configuration of a semiconductor memory device 300 according to the second embodiment.

Referring to FIG. 13, semiconductor memory device 300 includes, in the configuration of semiconductor memory device 1 shown in FIG. 1, a terminal 310 receiving a power-supply potential B-VCC and a terminal 312 receiving a power-supply potential AC-VCC in place of terminals 10 and 12. Terminal 310 is connected to a power-supply node for supplying power-supply potential VCC to memory B. Terminal 312 is connected to a power-supply node of memory A and a power-supply node of memory C for supplying power-supply potential VCC to memory A and memory C.

The other configurations are similar to those of semiconductor memory device 1 shown in FIG. 1, so that the description thereof will not be repeated.

Figure 14:
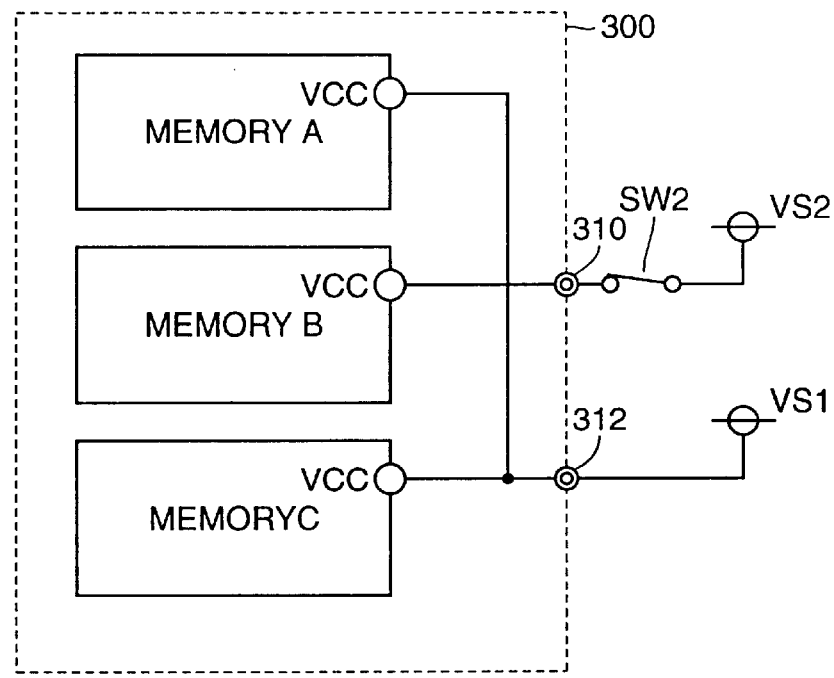
FIG. 14 illustrates the operating state of semiconductor memory device 300.
Figure 15:
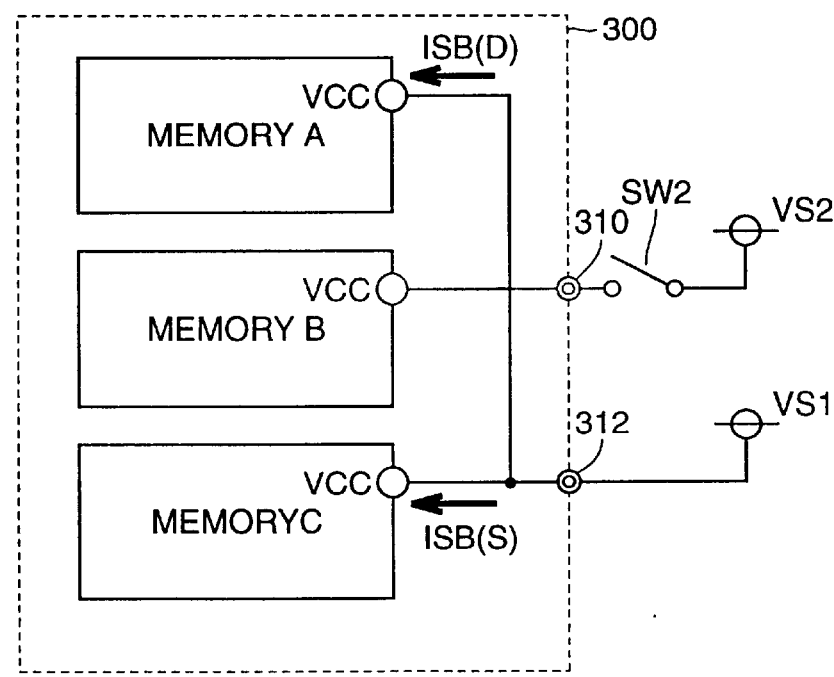
FIG. 15 illustrates the stand-by state of semiconductor memory device 300.

FIGS. 14 and 15 illustrate the operating state and the stand-by state of semiconductor memory device 300.

Referring to FIG. 14, in the operating state, terminal 310 is supplied with a power-supply potential VS2, whereas terminal 312 is supplied with a power-supply potential VS1.

Referring to FIG. 15, in the stand-by state, a switch SW2 is made open to stop supplying of power-supply potential VS2 to terminal 310. This stops power-supplying to the non-volatile memory B, and thus no consumption current is generated in memory B. On the other hand, memories A and C are continuously supplied with power-supply potential VS1 via terminal 312. Therefore, stand-by current will be a sum of stand-by current ISB(D) of memory A and stand-by current ISB(S) of memory C.

In the case of the semiconductor memory device according to the second embodiment, though the stand-by current is increased by the amount of the consumption current of memory A compared to the first embodiment, there is an effect in that a large capacity of data reading/writing can be performed at high speed even in the stand-by state. It is noted that the stand-by current may be reduced by the amount of the stand-by current of memory B if two separate power-supply terminals are used.

Third Embodiment

Figure 16:
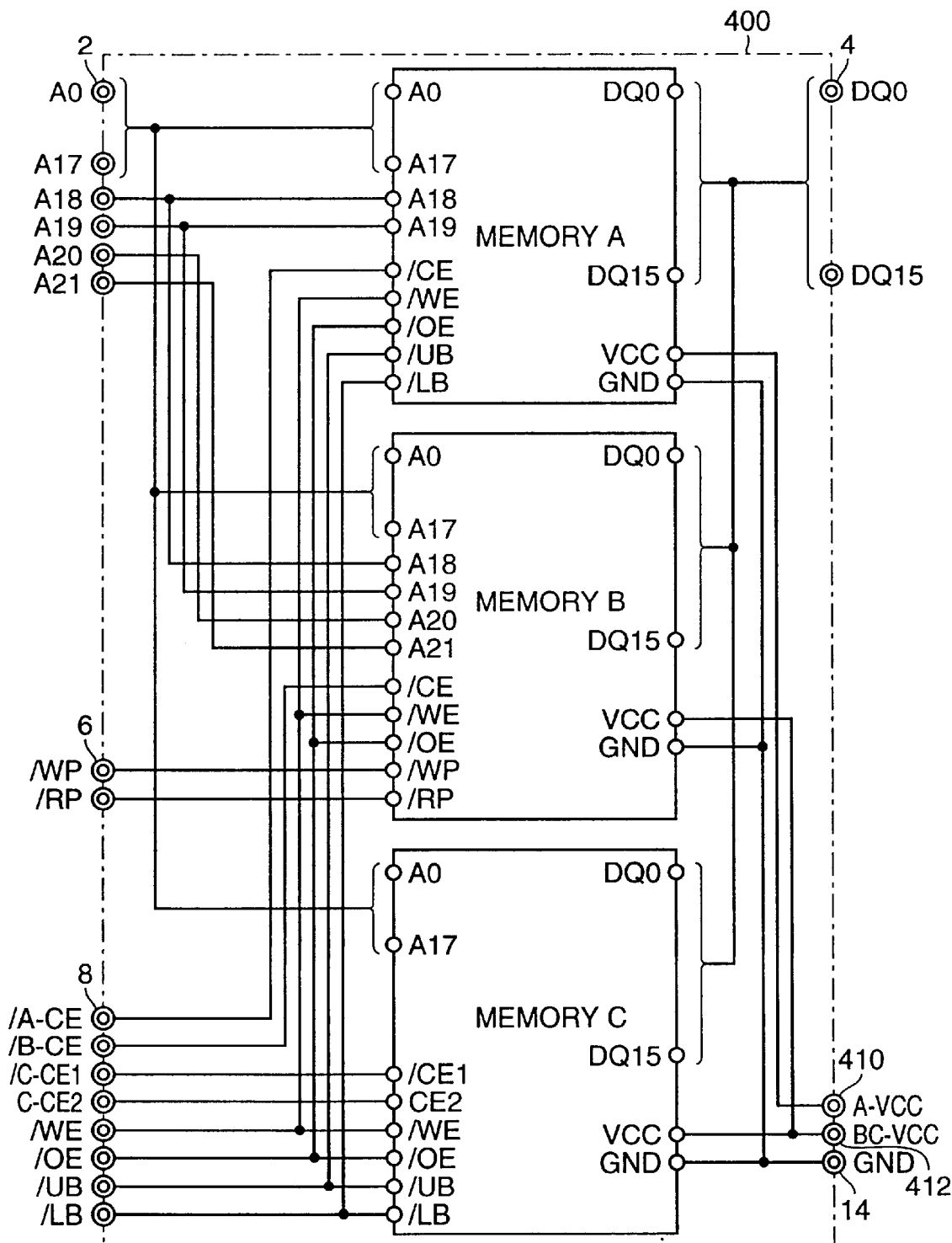
FIG. 16 is a schematic block diagram showing the configuration of a semiconductor memory device 400 according to the third embodiment.

FIG. 16 is a schematic block diagram showing the configuration of a semiconductor memory device 400 according to the third embodiment.

Referring to FIG. 16, semiconductor memory device 400 includes, in the configuration of semiconductor memory device 1 shown in FIG. 1, a power-supply terminal 410 receiving power-supply potential A-VCC and a power-supply terminal 412 receiving power-supply potential BC-VCC, in place of terminals 10 and 12. Terminal 410 is connected to a power-supply node for supplying power-supply potential VCC to memory A. Terminal 412 is connected to a power-supply node for supplying power-supply potential VCC to memories B, C.

The other configurations are similar to those of semiconductor memory device 1 shown in FIG. 1, so that the description will not be repeated.

Figure 17:
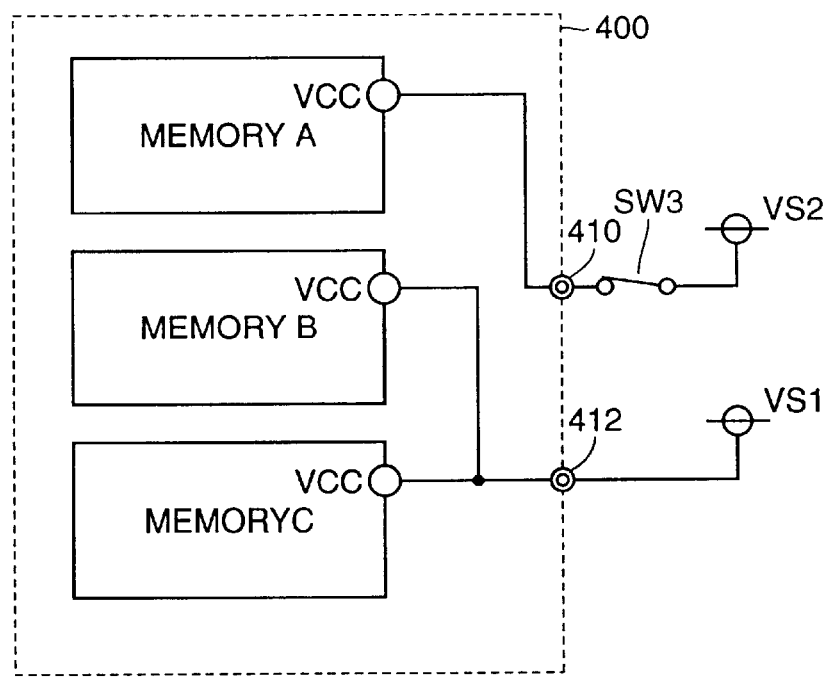
FIG. 17 illustrates the operating state of semiconductor memory device 400.
Figure 18:
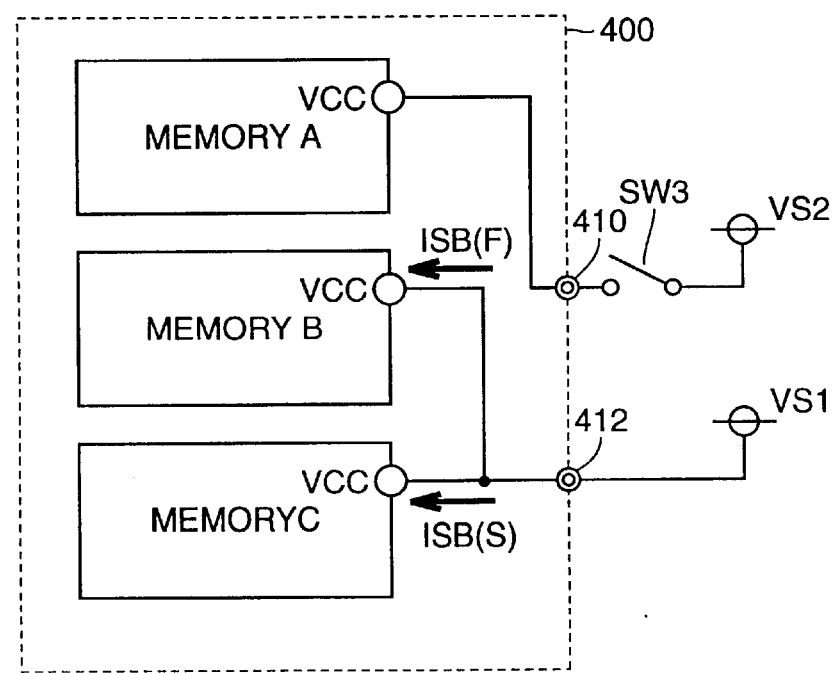
FIG. 18 illustrates the stand-by state of semiconductor memory device 400.

FIGS. 17 and 18 illustrate the operating state and the stand-by state of semiconductor memory device 400 according to the third embodiment.

Referring to FIG. 17, in the operating state, memory A is supplied with power-supply potential VS2 via terminal 410, whereas memories B, C are supplied with power-supply potential VS1 via terminal 412.

Referring to FIG. 18, in the stand-by state, a switch SW3 is made open to stop supplying of power-supply potential VS2 to terminal 410. Therefore, the stand-by current of semiconductor memory device 400 is a sum of stand-by current ISB(F) of memory B and stand-by current ISB(S) of memory C.

For example, memory A is suitable for the purpose of fast reading/writing of a large capacity of data, so that it is used for, e.g. image processing. However, only conversation may be performed in e.g. a portable telephone, and hence there is no need to always perform the image processing. Therefore, memory A may be supplied with the power-supply potential during when, e.g. the Internet is being accessed, while the power-supply potential to memory A may be stopped during the normal conversation, in order to reduce the consumption current.

Figure 19:
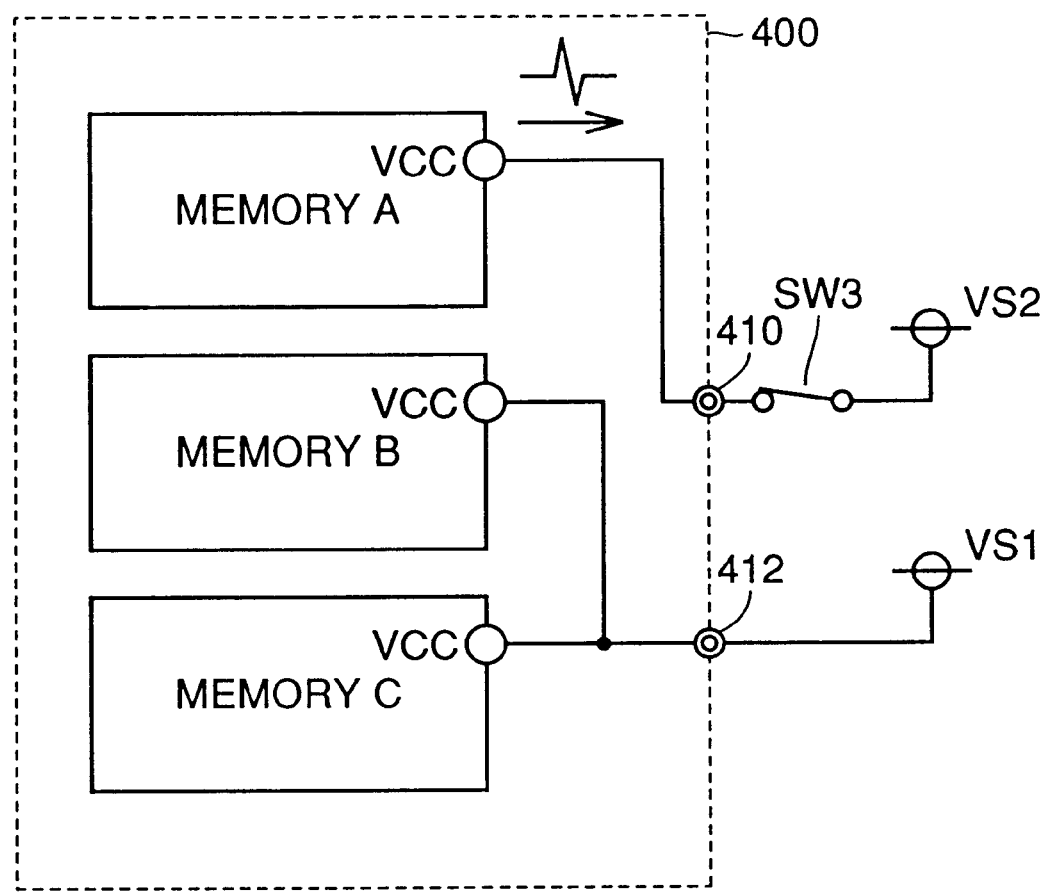
FIG. 19 illustrates another effect of the invention according to the third embodiment.

FIG. 19 illustrates another effect of the invention according to the third embodiment.

Referring to FIG. 19, memory A is a dynamic-type memory, and is to read/write a large capacity of data at high speed. Thus, power-supply noise is often generated from the power-supply terminal at transmitting/receiving data. Separation of terminals 412 and 410 can alleviate the power-supply noise generated in memory A sneaking into memory B or C.

As described above, in the semiconductor memory device according to the third embodiment, reduction of consumption current as well as prevention of malfunction due to the power-supply noise are enabled.

Fourth Embodiment

Figure 22:
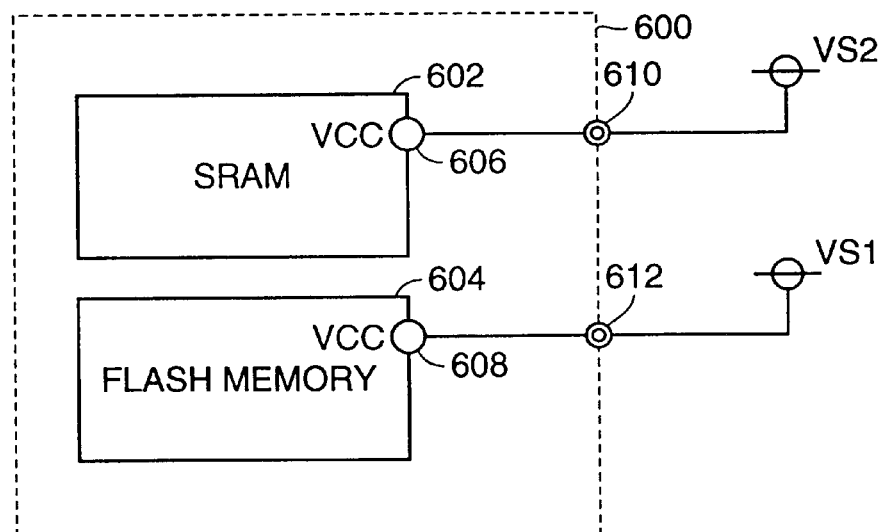
FIG. 22 schematically shows the configuration of the conventional semiconductor memory device 600.

In the first to third embodiments described above, compatibility with semiconductor memory device 600 shown in FIG. 22 was easily attained by employing two power-supply terminals.

When there is no need to consider pin compatibility with a conventional product and when there are a sufficient number of terminals, a power-supply lead dedicated to each of three memory circuits may be assigned.

Figure 20:
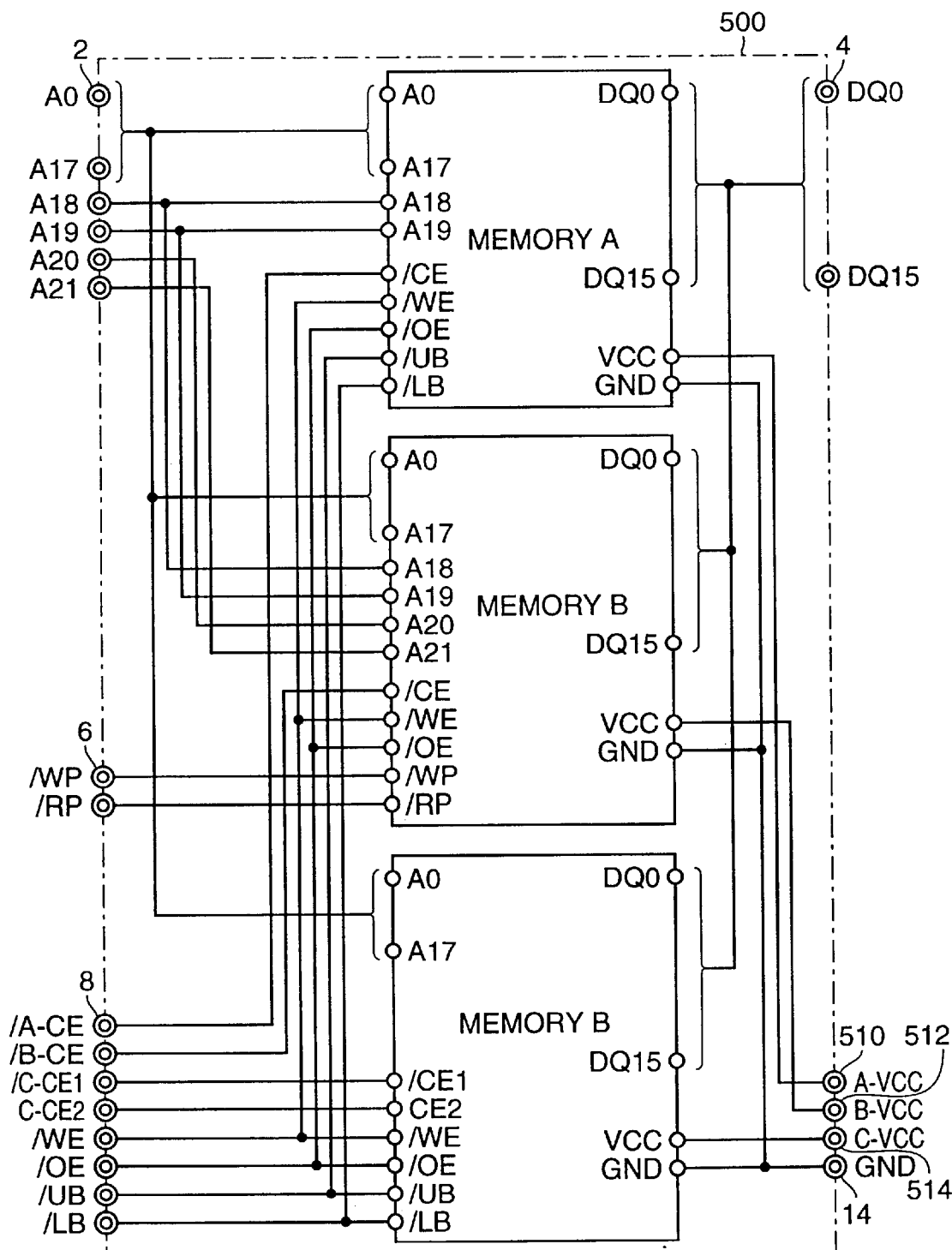
FIG. 20 is a block diagram showing the configuration of a semiconductor memory device 500 according to the fourth embodiment.

FIG. 20 is a block diagram showing the configuration of a semiconductor memory device 500 according to the fourth embodiment.

Referring to FIG. 20, semiconductor memory device 500 includes, in the configuration of semiconductor memory device 1 shown in FIG. 1, a terminal 510 receiving power-supply potential A-VCC, a terminal 512 receiving power-supply potential B-VCC and a terminal 514 receiving power-supply potential C-VCC, in place of terminals 10, 12.

Terminal 510 is connected to a power-supply node for supplying power-supply potential VCC to memory A. Terminal 512 is connected to a power-supply node for supplying power-supply potential VCC to memory B. Terminal 514 is connected to a power-supply node for supplying power-supply potential VCC to memory C.

The other configurations are similar to those of semiconductor memory device 1 shown in FIG. 1, so that the description thereof will not be repeated.

Figure 21:
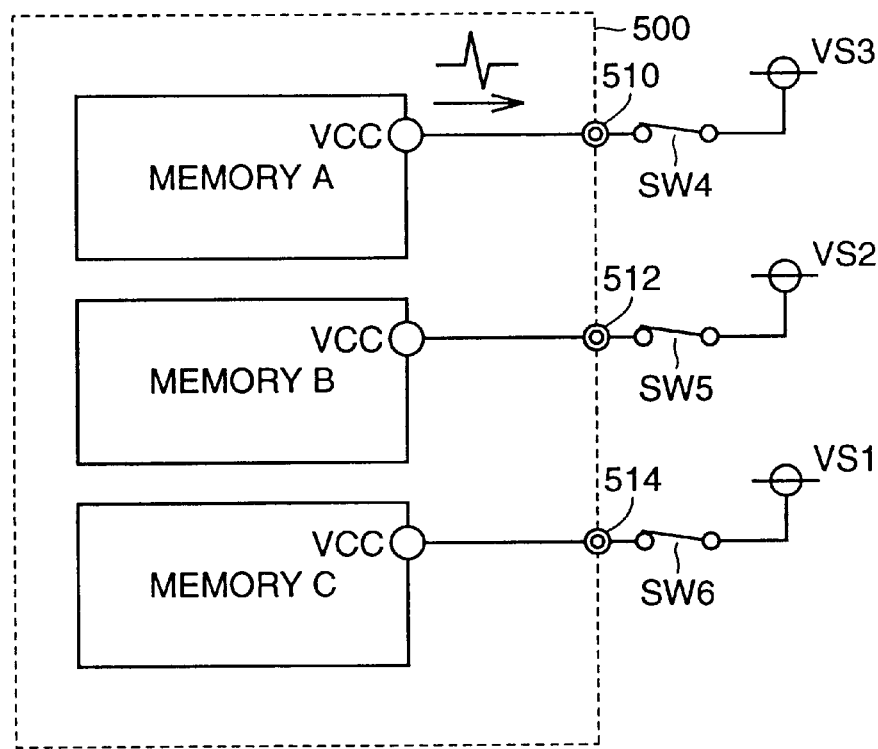
FIG. 21 is a schematic view illustrating a semiconductor memory device 500.

FIG. 21 is a schematic view illustrating semiconductor memory device 500 according to the fourth embodiment.

Referring to FIG. 21, three separate terminals are employed for supplying the power-supply potential to memories A, B and C, alleviating the power-supply noise generated from memory A sneaking into the power-supply of memory B or C.

Furthermore, independent control of the respective switches SW4, SW5 and SW6 allows supplying of the power-supply potential independently to the respective memories A, B and C. Therefore, the power-supply potential can be supplied only to a requiring memory according to the circumstances, and hence reduction of the consumption current can more flexibly be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for receiving/transmitting storage data from/to an external source, comprising:
   a first dynamic volatile memory circuit for receiving a supply of a power-supply potential from a first power-supply node;
   a second static volatile memory circuit for receiving a supply of a power-supply potential from a second power-supply node;
   a non-volatile memory circuit for receiving a supply of a power-supply potential from a third power-supply node;
   a package enclosing said first and second volatile memory circuits and said non-volatile memory circuit;
   a first lead connected to said first and third power-supply nodes and for supplying a first power-supply potential from a source external to said package; and
   a second lead connected to said second power-supply node and for supplying a second power-supply potential from a source external to said package, independent of said first power-supply potential.

2. A semiconductor memory device for receiving/transmitting storage data from/to an external source, comprising:
   a first volatile memory circuit of a first type, for receiving a supply of a power-supply potential from a first power-supply node;
   a second volatile memory circuit of a second type different from said first type, for receiving a supply of a power-supply potential from a second power-supply node;
   a non-volatile memory circuit for receiving a supply of a power-supply potential from a third power-supply node; and
   a package enclosing said first and second volatile memory circuits and said non-volatile memory circuit, wherein
      said first volatile memory circuit includes a plurality of first data input/output nodes for transferring said storage data,
      said second volatile memory circuit includes a plurality of second data input/output nodes for transferring said storage data,
      said non-volatile memory circuit includes a plurality of third data input/output nodes for transferring said storage data,
      said semiconductor memory device further comprises a plurality of data input/output leads for transferring said storage data between said plurality of first to third data input/output nodes and a source external to said package, and
      said plurality of first to third data input/output nodes are respectively connected to said plurality of data input/output leads, corresponding bits by bits, within said package.

3. A semiconductor memory device for receiving/transmitting storage data from/to an external source, comprising:
   a first volatile memory circuit of a first type, for receiving a supply of a power-supply potential from a first power-supply node;
   a second volatile memory circuit of a second type different from said first type, for receiving a supply of a power-supply potential from a second power-supply node;

a non-volatile memory circuit for receiving a supply of a power-supply potential from a third power-supply node; and a package enclosing said first and second volatile memory circuits and said non-volatile memory circuit, wherein said first volatile memory circuit includes a plurality of first address input nodes for receiving an address signal corresponding to said storage data, said second volatile memory circuit includes a plurality of second address input nodes for receiving said address signal, said non-volatile memory circuit includes a plurality of third address input nodes for receiving said address signal, said semiconductor memory device further comprises a plurality of address input leads for inputting an address signal from a source external to said package to said plurality of first to third address input nodes, and said plurality of first to third address input nodes are connected to said plurality of address input leads, at least a part of corresponding bits by bits, within said package.

4. A semiconductor memory device for receiving/transmitting storage data from/to an external source, comprising:

a first volatile memory circuit of a first type, for receiving a supply of a power-supply potential from a first power-supply node;

a second volatile memory circuit of a second type different from said first type, for receiving a supply of a power-supply potential from a second power-supply node;

a non-volatile memory circuit for receiving a supply of a power-supply potential from a third power-supply node;

a package enclosing said first and second volatile memory circuits and said non-volatile memory circuit;

a first chip on which said first volatile memory circuit is formed;

a second chip on which said second volatile memory circuit is formed; and a third chip on which said non-volatile memory circuit is formed.

5. A semiconductor memory device for receiving/transmitting storage data from/to an external source, comprising:

a first dynamic volatile memory circuit for receiving a supply of a power-supply potential from a first power-supply node;

a second static volatile memory circuit for receiving a supply of a power-supply potential from a second power-supply node;

a non-volatile memory circuit for receiving a supply of a power-supply potential from a third power-supply node; and a package enclosing said first and second volatile memory circuits and said non-volatile memory circuit, wherein said first dynamic volatile memory circuit includes a first memory array having a plurality of first memory cells of the dynamic type, said second static volatile memory circuit includes a second memory array having a plurality of second memory cells of the static type, and said non-volatile memory circuit includes a third memory array having a plurality of non-volatile memory cells.

6. The semiconductor memory device according to claim 5, wherein each of said plurality of first memory cells includes
a capacitance element for holding said storage data as electric charge, and
a first transfer transistor connected to an end of said capacitance element, and for performing reading of said storage data from said capacitance element and writing of said storage data to said capacitance element;

each of said plurality of second memory cells includes
a flip-flop circuit for holding said storage data at first and second internal nodes complementary to each other, and
second and third transfer transistors respectively connected to said first and second internal nodes, and for performing reading of said storage data from said flip-flop circuit and writing of said storage data to said flip-flop circuit; and each of said plurality of third memory cells includes a transistor having a floating gate, for holding said storage data depending on a magnitude of a threshold voltage.

7. A semiconductor memory device for receiving/transmitting storage data from/to an external source, comprising:

a first dynamic volatile memory circuit for receiving a supply of a power-supply potential from a first power-supply node;

a second static volatile memory circuit for receiving a supply of a power-supply potential from a second power-supply node;

a non-volatile memory circuit for receiving a supply of a power-supply potential from a third power-supply node;

a package enclosing said first and second volatile memory circuits and said non-volatile memory circuit;

a first lead connected to said first and second power-supply nodes, and for supplying a first power-supply potential from a source external to said package; and a second lead connected to said third power-supply node, and for supplying a second power-supply potential from a source external to said package, independent of said first power-supply potential.

8. A semiconductor memory device for receiving/transmitting storage data from/to an external source, comprising:

a first dynamic volatile memory circuit for receiving a supply of a power-supply potential from a first power-supply node;

a second static volatile memory circuit for receiving a supply of a power-supply potential from a second power-supply node;

a non-volatile memory circuit for receiving a supply of a power-supply potential from a third power-supply node;

a package enclosing said first and second volatile memory circuits and said non-volatile memory circuit;

a first lead connected to said second and third power-supply nodes, and for supplying a first power-supply potential from a source external to said package; and a second lead connected to said first power-supply node, and supplying for a second power-supply potential from a source external to said package, independent of said first power-supply potential.

9. A semiconductor memory device for receiving/transmitting storage data from/to an external source, comprising:

a first dynamic volatile memory circuit for receiving a supply of a power-supply potential from a first power-supply node;

a second static volatile memory circuit for receiving a supply of a power-supply potential from a second power-supply node;

a non-volatile memory circuit for receiving a supply of a power-supply potential from a third power-supply node;

a package enclosing said first and second volatile memory circuits and said non-volatile memory circuit;

a first lead connected to said first power-supply node, and for supplying a first power-supply potential from a source external to said package;

a second lead connected to said second power-supply node, and for supplying a second power-supply potential from a source external to said package, independent of said first power-supply potential; and a third lead connected to said third power-supply node, and for supplying a third power-supply potential from a source external to said package, independent of said first and second power-supply potentials.

* * * * *